United States Patent [19]
Dohi et al.

[11] Patent Number: 5,583,460
[45] Date of Patent: Dec. 10, 1996

[54] OUTPUT DRIVER CIRCUIT FOR RESTRAINING GENERATION OF NOISE AND SEMICONDUCTOR MEMORY DEVICE UTILIZING SUCH CIRCUIT

[75] Inventors: Yoshitsugu Dohi; Toru Shiomi; Yoshito Nakaoka, all of Hyogo-ken, Japan

[73] Assignee: Mitsubishi Denki Kabushiki Kaisha, Tokyo, Japan

[21] Appl. No.: 331,240

[22] Filed: Oct. 28, 1994

Related U.S. Application Data

[63] Continuation of Ser. No. 43,697, Apr. 8, 1993, abandoned.

[30] Foreign Application Priority Data

Jun. 18, 1992 [JP] Japan .................................. 4-159468

[51] Int. Cl.$^6$ .................................................. H03K 17/30
[52] U.S. Cl. .......................... 327/126; 327/108; 327/170; 327/313; 327/382; 327/391; 326/24; 326/121
[58] Field of Search ........................ 307/263, 443, 307/451, 542, 572, 573, 574, 575, 576, 577, 579; 326/17, 21, 23, 24, 29, 31, 121; 327/108, 126, 170, 310, 313, 379, 381, 391, 382, 389

[56] References Cited

U.S. PATENT DOCUMENTS

| | | | |
|---|---|---|---|
| 4,450,371 | 5/1984 | Bismarck | 307/263 |
| 4,532,436 | 7/1985 | Bismarck | 307/263 |
| 4,591,734 | 5/1986 | Laughton | 327/381 |
| 4,612,466 | 9/1986 | Stewart | 307/585 |
| 4,731,553 | 3/1988 | Van Lehn et al. | 307/451 |
| 4,749,882 | 6/1988 | Morgan | 307/263 |
| 4,779,013 | 10/1988 | Tanaka | 307/451 |
| 4,880,997 | 11/1989 | Steele | 307/263 |
| 4,918,339 | 4/1990 | Shigeo et al. | 307/542 |
| 5,117,131 | 5/1992 | Ochi et al. | 307/443 |
| 5,216,293 | 6/1993 | Sei et al. | 307/263 |
| 5,237,213 | 8/1993 | Tanoi | 307/572 |
| 5,323,071 | 6/1994 | Hirayama | 326/21 |
| 5,457,415 | 10/1995 | Schlig | 327/427 |

FOREIGN PATENT DOCUMENTS

| | | |
|---|---|---|
| 61-125222 | 6/1986 | Japan . |
| 62-48806 | 3/1987 | Japan . |
| 64-16016 | 1/1989 | Japan . |
| 2-21721 | 1/1990 | Japan . |
| 2-47918 | 2/1990 | Japan . |

*Primary Examiner*—Terry D. Cunningham
*Attorney, Agent, or Firm*—Lowe, Price, LeBlanc & Becker

[57] ABSTRACT

An improved output driver circuit for a semiconductor integrated circuit device, wherein a stepped control voltage generation circuit is connected to the gate of a driving transistor for driving an output terminal DQ. The stepped control voltage generation circuit responds to an applied input data signal to provide a stepped control voltage changing in a stepped form including a plurality of steps to the gate of the driving transistor. The driving transistor therefore changes its state on a step by step basis from a cut off state to a conduction state. Thus, sharp change in output current flowing through the output terminal can be prevented, and noise caused by a parasitic inductance can be avoided, thus preventing an erroneous operation in the device.

7 Claims, 16 Drawing Sheets

5,583,460

OUTPUT DRIVER CIRCUIT FOR RESTRAINING GENERATION OF NOISE AND SEMICONDUCTOR MEMORY DEVICE UTILIZING SUCH CIRCUIT

This application is a continuation of application Ser. No. 08/043,697 filed Apr. 8, 1993 now abandoned.

BACKGROUND OF THE INVENTION

1. Field of the Invention

The present invention relates generally to output driver circuits for semiconductor integrated circuit devices, and more specifically, to an output driver circuit capable of restraining generation of noise. The invention has particular applicability to a semiconductor memory device.

2. Description of the Background Art

Generally, a plurality of semiconductor integrated circuit devices are placed on a printed circuit board, and their input/output terminals are connected one another through interconnections provided on the printed circuit board. Accordingly, when an output signal is output from a semiconductor integrated circuit device, an interconnection and another semiconductor integrated circuit device, i.e. a load connected to the output terminal (or output lead) is driven by the output signal.

Generally, an output driver circuit for driving a load connected to an output terminal is provided in the output stage of a semiconductor integrated circuit device. Loads connected to output terminals vary in size, therefore a large load is connected in some cases and a small load is connected in other cases. Transistors having a large mutual conductance (or current driving capability) are usually used in the final stage of an output driver circuit so that a large load can be driven.

The invention is generally applicable to an output driver circuit provided in the output stage of a semiconductor integrated circuit device, but applications of the invention to semiconductor memories will be described in the following by way of illustration.

FIG. 19 is a block diagram showing the circuit of a conventional static random access memory (hereinafter referred to as "SRAM"). Referring to FIG. 19, the SRAM 100 includes an address buffer 84 for receiving an X address signal XA and a Y address signal YA which are externally applied, an X decoder 85 and a Y decoder 86 for decoding the address signals XA and XA, a word line driving circuit 87 for driving word lines 3a to 3d, a column selection circuit 88 for selecting bit line pairs 6a, 6b to 9a, 9b, and a memory cell array 97 including memory cells MC each connected to a corresponding word line and a corresponding bit line pair.

The SRAM 100 further includes a local sense amplifier 89 for amplifying a data signal read out from a memory cell MC, a sense amplifier activation circuit 90 for activating the local sense amplifier 89, a writing amplifier 91 for amplifying an input data signal DI to be written, a data writing circuit 92 for writing a data signal in a memory cell MC, a main sense amplifier 94 for amplifying an output signal from the local sense amplifier 89, a clamp potential generation circuit 93 for applying a clamp potential to the main sense amplifier 94, a level conversion circuit 95 for converting a TTL level signal output from the main sense amplifier 94 into an MOS level signal, and an output driver circuit 96 for driving a load connected to an output terminal DQ in response to the converted signal. The line 100 also represents a semiconductor substrate.

In a data writing operation, the X address signal XA and the Y address signal YA are applied to the X decoder 85 and the Y decoder 86 through the address buffer 84. The X decoder 85 selectively activates one of the word lines 3a to 3d by decoding the X address signal XA. The Y decoder 86 selects one of the bit line pairs 6a, 6b to 9a 9b by decoding the Y address signal YA. The input data signal DI is provided to the data writing circuit 92 through the writing amplifier 91. The data writing circuit 92 amplifies the provided data signal and drives the bit line pair selected by the Y decoder 86. As a result, the input data signal DI is stored in the memory cell MC decided by the activated word line and the selected bit line pair.

In a reading operation, the X decoder 85 selectively activates one of the word lines 3a to 3d by decoding the externally applied X address signal XA. A data signal stored in the memory cell MC connected to the activated word line is applied on the respective bit line pairs 6a, 6b to 9a, 9b. The Y decoder 86 selects one bit line pair by decoding the externally applied Y address signal YA. Accordingly, a data signal on the one bit line pair is selectively applied to the local sense amplifier 89. The data signal amplified by the local sense amplifier 89 is provided to the main sense amplifier 94 and amplified therein.

The data signal amplified by the main sense amplifier 94 is limited within the range of a so-called TTL level, and therefore the level conversion circuit 95 conducts a level conversion from the TTL level to the MOS level. The converted data signal is provided to the output driver circuit 96, and the output driver circuit 96 in turn drives a load connected to the output terminal DQ in response to the applied signal.

FIG. 20 is a circuit diagram showing one example of a memory cell utilized in the SRAM 100 shown in FIG. 19. Referring to FIG. 20, the memory cell of a high resistance load type includes resistors R1, R2 having a high resistance value, NMOS transistors Q1, Q2 as a driving transistor, and NMOS transistors Q3, Q4 as an access transistor.

FIG. 21 is a circuit diagram showing another example of a memory cell utilized in the SRAM 100 shown in FIG. 19. Referring to FIG. 21, the CMOS memory cell includes a PMOS transistor Q5 provided in place of the resistors R1, R2 shown in FIG. 20, and NMOS transistors Q1 to Q4.

FIG. 23 is a circuit diagram showing the output driver circuit 96 shown in FIG. 19. Referring to FIG. 23, the conventional output driver circuit 96 includes a PMOS transistor 10 and an NMOS transistor 20 connected in series between a power supply potential Vcc and a ground potential Vss, an NAND gate 77 for supplying a control voltage to the gate of transistor 10, and an NOR gate 76 for applying a control voltage to the gate of transistor 20. A data signal RD output from the level conversion circuit 95 is applied to respective one inputs of NAND gate 77 and NOR gate 76. An externally applied output enable signal /OE is applied to the other input of NOR gate 76. The other input of NAND gate 77 receives the inverse of the output enable signal /OE from an inverter 79. The output terminal DQ is connected to a common connection node of the transistors 10 and 20.

In operation, when the output enable signal /OE of a low level is externally applied, the NAND gate 77 and the NOR gate 76 operate as inverters. More specifically, NAND gate 77 inverts the applied data signal RD and applies the inverted signal to the gate of transistor 10. The NOR gate 76 inverts the applied data signal RD and applies the inverted signal to the gate of transistor 20. As a result, one of the transistors 10 and 20 is selectively turned on in response to the data signal RD and the load connected to the output terminal DQ is driven.

When the output enable signal /OE is in a high level, the NAND gate 77 and the NOR gate 76 output output signals of a high level and a low level, respectively. In other words, regardless of the applied data signal RD, fixed potentials are provided to the gates of transistors 10 and 20. At that time, since the transistors 10 and 20 are turned off, the output terminal DQ is brought into a floating state (i.e. it is not driven).

As described above, since various loads (not shown) are connected to the output terminal DQ, the mutual conductance between transistors 10 and 20 (or current driving capability) is designed to be a value sufficient for driving these loads. Accordingly, when a large load is connected to the output terminal DQ, a large current flows through the output terminal DQ and the transistors 10 or 20.

FIG. 22 is a circuit diagram schematically showing a semiconductor memory actually installed on a printed wiring board. Referring to FIG. 22, the semiconductor memory 300 is connected between a power supply line Vcc and a ground line Vss. The semiconductor memory 300 receives an input data signal through a data input terminal DI, and drives a load 303 through the data output terminal DQ. A driving transistor in the output driver circuit of the semiconductor memory 300 has a mutual conductance large enough for driving the load 303, and therefore an output current Io flowing through the output terminal DQ has a waveform with sharp risings and fallings. In other words, the output current Io contains high frequency signal component. Therefore, parasitic inductances 301 and 302 which are not negligible exist with respect to the high frequency signal component between each power supply line Vcc and the ground line Vss as shown in FIG. 22. Assuming that the inductance values of parasitic inductances 301 and 302 are L, the voltage change ΔV caused by the flow of the current Io through these parasitic inductances 301, 302 is given by the following equation:

$$\Delta V = L \cdot (dIo/dt) \quad (1)$$

The voltage change ΔV given by equation (1) is transmitted to the power supply line Vcc and the ground line Vss as a noise, which will result in an erroneous operation in the semiconductor memory 300.

FIG. 24 is a signal waveform chart for use in illustration of such an erroneous operation in the semiconductor memory 300 shown in FIG. 22. Referring to FIG. 24, a write enable signal /WE rises at time t21, the voltage of output terminal DQ changes in response to an output data signal at time t22. Accordingly, the output current Io (not shown) flowing through the output terminal DQ is so steep that the potential of ground line Vss changes as illustrated in FIG. 24. As a result, the levels of input signals such as the write enable signal /WE and the output enable signal /OE change relatively to the ground level, resulting in an erroneous operation.

More specifically, in response to a change in the potential of the ground line Vss, the threshold voltage Vth of the buffer circuit receiving the externally applied write enable signal /WE, for example, changes relatively to a true ground level as represented by the chain dotted line in FIG. 24. Consequently, a detection of the signal WE being in a low level may be made in the semiconductor memory during the period from time t23 to time t24. As a result, an erroneous operation will be caused in the semiconductor memory.

SUMMARY OF THE INVENTION

It is an object of the invention to prevent generation of noise from an output driver circuit in a semiconductor integrated circuit device.

Another object of the invention is to prevent an erroneous operation from being caused by an output driver circuit in a semiconductor integrated circuit device.

A further object of the invention is to prevent generation of noise from an output driver circuit in a semiconductor memory device.

Yet another object of the invention is to prevent an erroneous operation from being caused by an output driver circuit in a semiconductor memory device.

Briefly stated, an output driver circuit in accordance with the invention includes a driving transistor connected between a power supply potential and an output terminal for driving a load connected to the output terminal, and a stepped control voltage generation circuit for generating a stepped control voltage changing in a stepped form including a plurality of steps, in response to an applied input signal. The stepped control voltage is supplied to the control electrode of the driving transistor.

In operation, since the driving transistor conducts gradually in response to the stepped control voltage supplied from the stepped control voltage generation circuit, steep change in the output current can be prevented, thereby restraining generation of noise by the output driver circuit.

According to another aspect of the invention, an output driver circuit includes a driving transistor connected between a power supply potential and an output terminal for driving a load connected to the output terminal, a control voltage generation circuit for generating a control voltage for controlling the driving transistor in response to an applied input signal, and a temporary voltage holding circuit for holding the control voltage generated from the control voltage generation circuit at a prescribed intermediate potential in response to an externally applied control signal. The control voltage generated from the control voltage generation circuit is a supplied to the control electrode of the driving transistor.

In operation, the control voltage generated from the control voltage generation circuit is temporarily held at the prescribed intermediate potential. Accordingly, the driving transistor does not conduct instantaneously, but is temporarily brought to an intermediate conduction state, and therefore steep change in the output current can be prevented, thereby restraining generation of noise by the output driver circuit.

According to a further aspect of the invention, a semiconductor memory device includes a memory cell array including a plurality of memory cells disposed in a matrix of rows and columns, a data reading circuit for reading data stored in the memory cells in the memory cell array in response to an applied control signal, and a data output circuit for outputting the data read out through the data reading circuit. The data output circuit includes a data output terminal, a driving transistor for driving a load connected to the data output terminal, and a stepped control voltage generation circuit for generating a stepped controlled voltage in response to a signal applied from the data reading circuit. The stepped controlled voltage is supplied to the control electrode of the driving transistor.

According to a still further aspect of the invention, a semiconductor memory device includes a memory cell array including a plurality of memory cells disposed in a matrix of rows and columns, a data reading circuit for reading out data stored in the memory cells in the memory cell array in response to an externally applied control signal, and a data output circuit for externally outputting the data signal read out through the data reading circuit. The data output circuit includes a driving transistor for driving a load connected to the data output terminal, a control voltage generation circuit for generating a control voltage for controlling the driving transistor in response to a signal applied from the data reading circuit, and a temporary voltage holding circuit for temporarily holding the control voltage generated from the control voltage generation circuit at a prescribed intermediate potential. The control voltage generated from the control voltage generation circuit is supplied to the control electrode of the driving transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
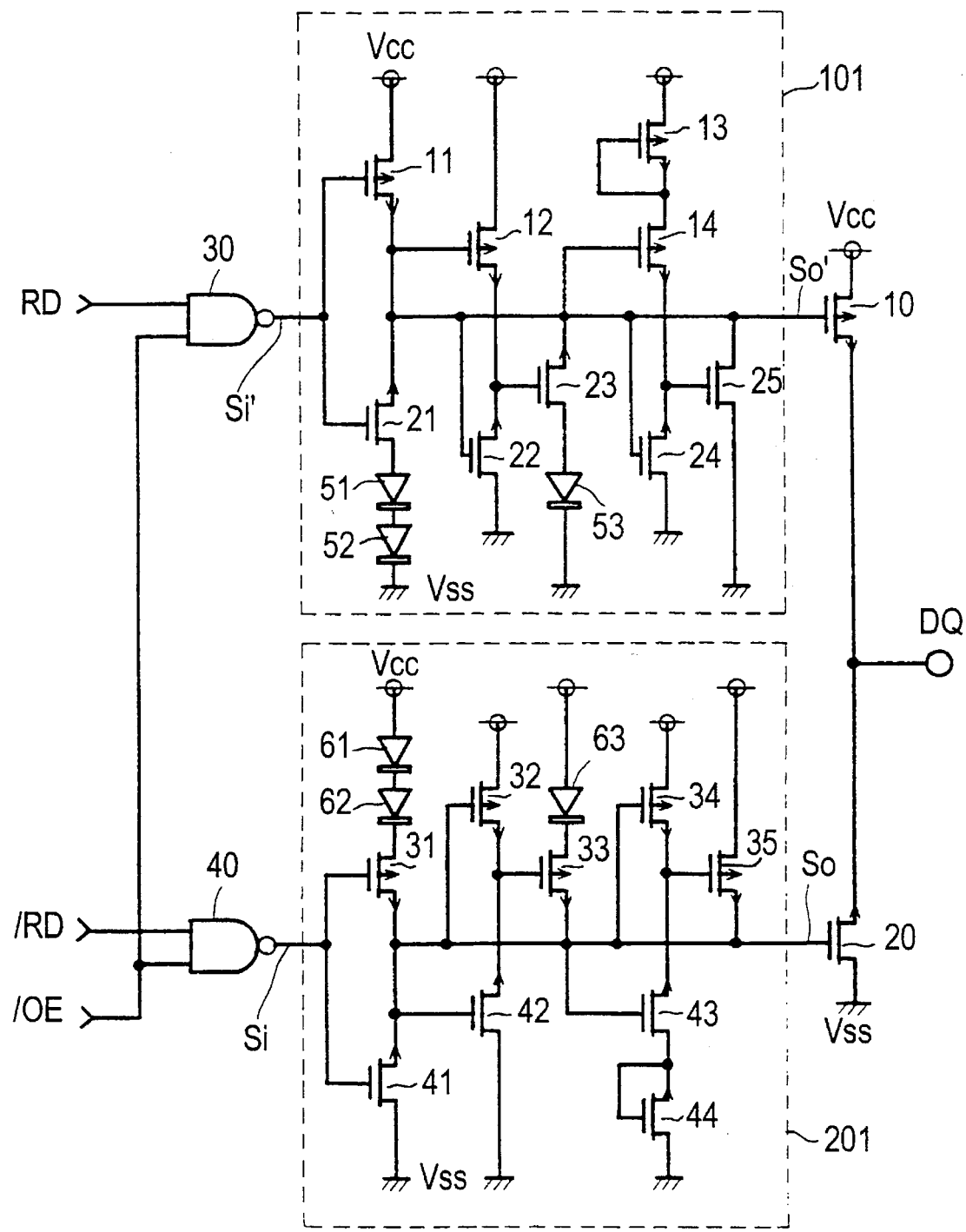
FIG. 1 is a circuit diagram showing an output driver circuit in accordance with one embodiment of the invention.

Referring to FIG. 1, an output driver circuit includes a PMOS transistor 10 and an NMOS transistor 20 connected in series between a power supply potential Vcc and a ground potential Vss, a stepped control voltage generation circuit 101 for supplying a stepped control voltage to the gate of transistor 10, and a stepped control voltage generation circuit 201 for supplying a stepped control voltage to the gate of transistor 20. The respective one inputs of NAND gates 30 and 40 receive an output enable signal /OE, the other input of NAND gate 30 receives a data signal RD. The other input of NAND gate 40 receives an inverted data signal /RD. An output data terminal DQ is connected to a common connection node of transistor 10 and 20.

The stepped control voltage generation circuit 101 includes a PMOS transistor 11, an NMOS transistor 21, and diodes 51 and 52 connected in series between the power supply potential Vcc and the ground potential Vss, a PMOS transistor 12 and an NMOS transistor 22 connected in series between the power supply potential Vcc and the ground potential Vss, PMOS transistors 13, 14 and an NMOS transistor 24 connected in series between the power supply potential Vcc and the ground potential Vss, an NMOS transistor 23 and a diode 53 connected in series between the gate of transistor 10 and the ground potential Vss, and an NMOS transistor 25 connected between the gate of transistor 10 and the ground potential Vss. The transistors 11 and 21 have their gates connected to the output node of NAND gate 30. The diodes 51, 52, and 53 are each formed of a diode-connected MOS transistor in this embodiment, but may be implemented by a diode-connected bipolar transistor.

The stepped control voltage generation circuit 201 includes diodes 61, 62, a PMOS transistor 31 and an NMOS transistor 41 connected in series between the power supply potential Vcc and the ground potential Vss, a PMOS transistor 32 and an NMOS transistor 42 connected in series between the power supply potential Vcc and the ground potential Vss, a PMOS transistor 34, and NMOS transistors 43 and 44 connected in series between the power supply potential Vcc and the ground potential Vss, a diode 63 and a PMOS transistor 33 connected in series between the power supply potential Vcc and the gate of transistor 20, and a PMOS transistor 35 connected between the power supply potential Vcc and the gate of transistor 20. The transistors 31 and 41 have their gates connected to the output node of NAND gate 40. Diodes 61, 62, and 63 are also each formed of a diode-connected MOS transistor, but may be implemented by a diode-connected bipolar transistor.

Figure 2:
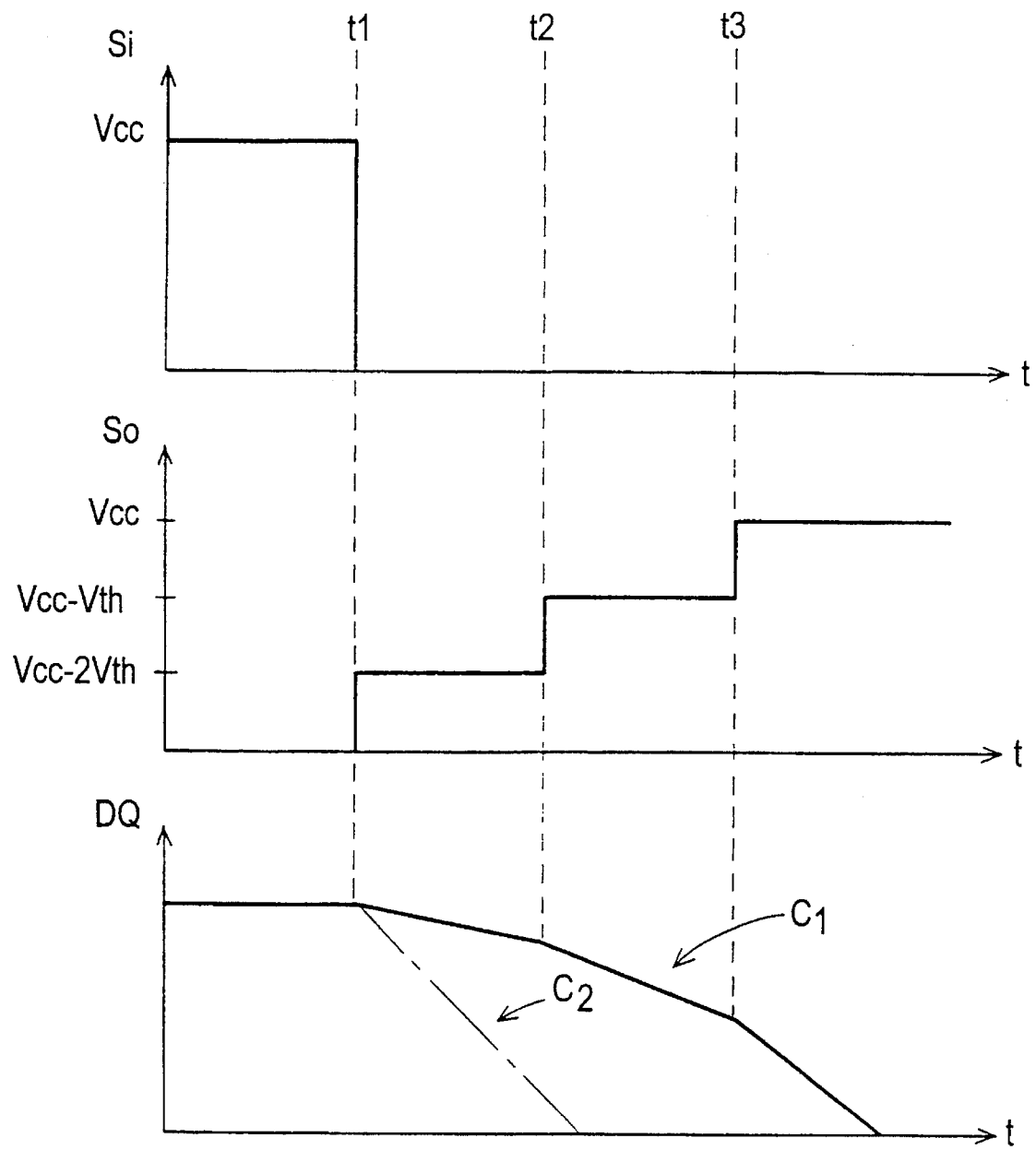
FIG. 2 is a timing chart for use in illustration of an operation of a stepped control voltage generation circuit shown in FIG. 1.

Operations of the stepped control voltage generation circuits shown in FIG. 1 will be described. FIG. 2 is a timing chart for illustrating an operation of the stepped control voltage generation circuit 201 shown in FIG. 1. Referring to FIGS. 1 and 2, an input signal Si of a high level in other words a power supply potential Vcc level is supplied from the NAND gate 40 until time t1. Accordingly, the transistor 41 conducts, and an output signal So of a low level in other words a ground potential level Vss is applied to the gate of driving transistor 20. Since the transistor 20 is turned off, the output terminal DQ is not pulled down.

At time t1, the input signal Si falls. The transistor 31 is turned on in response to the low level input signal Si, and the transistor 41 is turned off. Since each diode 61, 62, and 63 is formed of a diode-connected MOS transistor having a threshold voltage Vth, the voltage of the anode of the diode undergoes a level shift of Vth by one diode connection. Accordingly, by the conduction of the transistor 31, the voltage level of the output signal So becomes a level of Vcc–2Vth as illustrated in FIG. 2. The voltage level of the output signal So continues until time t2.

In response to the voltage Vcc–2Vth, the transistor 42 is turned on in an intermediate conduction state, and a voltage of a ground level is supplied to the gate of transistor 33. Therefore, since the transistor 33 is turned on at time t2, the voltage level of the output signal So after time t2 becomes Vcc–Vth as illustrated in FIG. 2. More specifically, by the conduction of the transistor 33, a voltage shifted by the amount of the threshold voltage Vth of diode 63 from the power supply voltage level Vcc is output as the output signal So. This output voltage level continues until time t3.

As illustrated in FIG. 1, the transistor 44 is connected between the transistor 43 and the ground potential Vss in a diode-connected form. Accordingly, the transistor 43 will not conduct unless the gate voltage of itself is at least Vss+2Vth. Therefore, the transistor 42 conducts before the transistor 43 does. The voltage Vcc–Vth is supplied to the gate of transistor 43 after time t2, thus turning on the transistor 43. Accordingly, the voltage Vss+Vth is supplied to the gate of transistor 35, and the transistor 35 is turned on after time t3 as a result. Therefore, after time t3, the voltage level of the output signal So becomes Vcc.

As a result, the output signal So output from the stepped control voltage generation circuit 201 has a signal waveform changing in a stepped form as illustrated in FIG. 2. Since the output signal So is applied to the gate of driving transistor 20, the transistor 20 changes gradually from a cut off state to a conduction state in response to the applied signal So. Consequently, the voltage of the output data signal applied to the output terminal DQ changes as represented by the curve C1 shown in FIG. 2.

In FIG. 2, the voltage change of the output data signal if there is not for the stepped control voltage generation circuit 201 is represented by the curve C2 for the purpose of comparison. As can be seen from a comparison between the curves C1 and C2, the voltage of the output terminal DQ descends relatively mildly by the provision of the stepped control voltage generation circuit 201. In contrast, the voltage of the output terminal DQ sharply falls if there is not for the stepped control voltage generation circuit 201 (the curve C2).

As described above, with the voltage of output terminal DQ gradually descending, sharp change in current supplied to a load through the output terminal DQ can be prevented. Accordingly, voltage change caused by the parasitic inductances 301 and 302 shown in FIG. 22 due to sharp current change can be prevented, thereby preventing voltage change at the power supply line Vcc and the ground line Vss.

The stepped control voltage generation circuit 201 illustrated in FIG. 1 generates a stepped control voltage rising as shown in FIG. 2, while the stepped control voltage generation circuit 101 generates a descending stepped control voltage. In the following, an operation of the stepped control voltage generation circuit 101 illustrated in FIG. 1 will be described.

Referring to FIG. 1, an input signal Si' of a low level is applied from the NAND gate 30. Since the transistor 11 is turned on in response to the input signal Si', an output signal So' of a high level, in other words a power supply voltage Vcc level, is applied to the gate of transistor 10. The transistor 10 is turned off as a result, and, therefore, the output terminal DQ is not pulled up.

When the input signal Si' of a high level is applied from the NAND gate 30, the transistor 21 conducts. The diodes 51, 52, and 53 are each formed of an MOS transistor having a threshold voltage Vth, the voltage applied to its anode is shifted by Vth. Accordingly, the output signal So' of Vss+2Vth is output by the conduction of transistor 21.

Since the transistor 12 is turned on in response to the voltage Vss+2Vth, a voltage of the power supply voltage Vcc level is supplied to the gate of transistor 23, thus turning on the transistor 23. By the conduction of transistor 23, the voltage Vss+Vth is output as the output signal So'.

The transistor 13 is connected between the power supply potential Vcc and the transistor 14 in a diode-connected form. Therefore, the transistor 14 will not conduct unless the gate voltage is less than Vcc–2Vth. Accordingly, the transistor 12 conducts before the transistor 14 does.

The transistor 14 is turned on in response to the gate voltage Vss+Vth, the voltage Vcc+Vth is applied to the gate of transistor 25. Thus, the transistor 25 is turned on, the voltage level of output signal So' descends to the Vss level.

Figure 22:
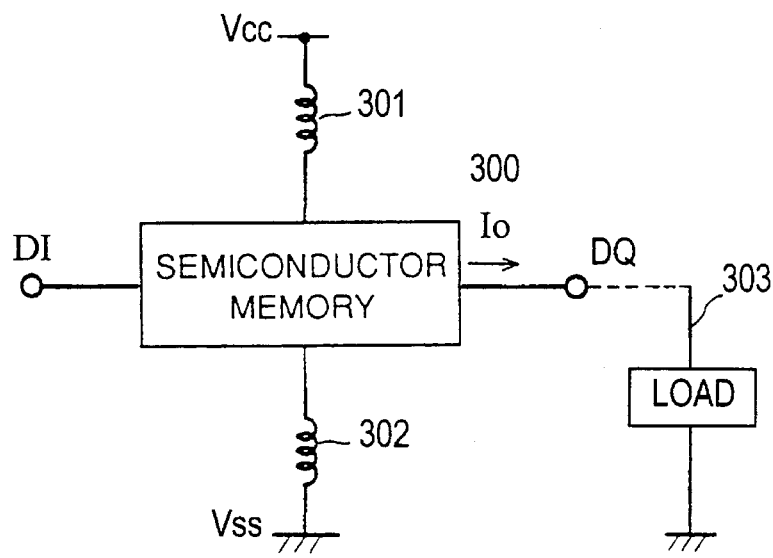
FIG. 22 is a circuit diagram schematically showing a semiconductor memory actually installed on a printed wiring board.
Figure 23:
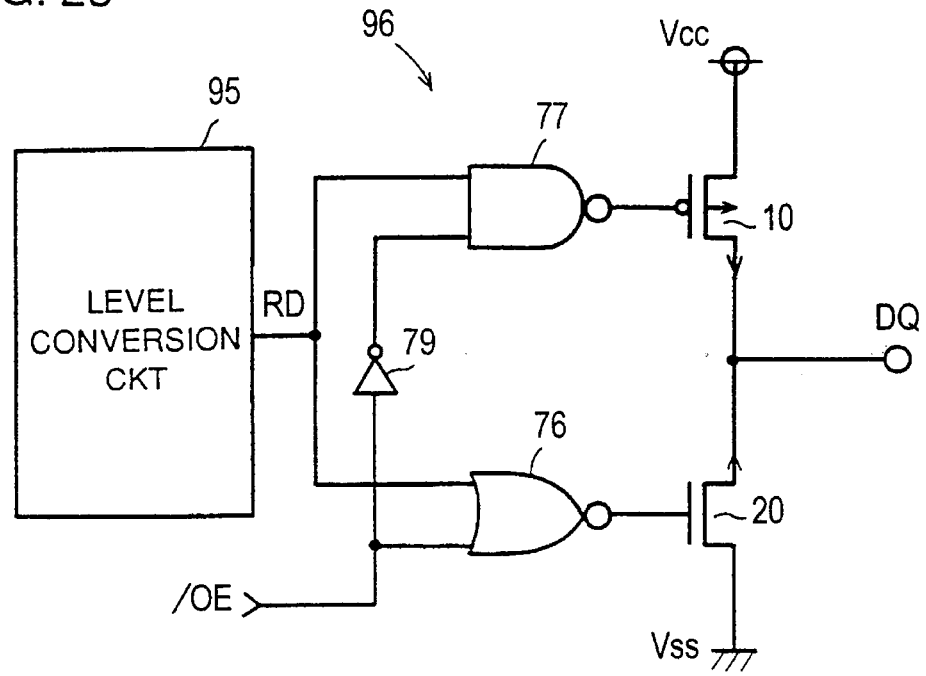
FIG. 23 is a circuit diagram showing an output driver circuit shown in FIG. 19.
Figure 24:
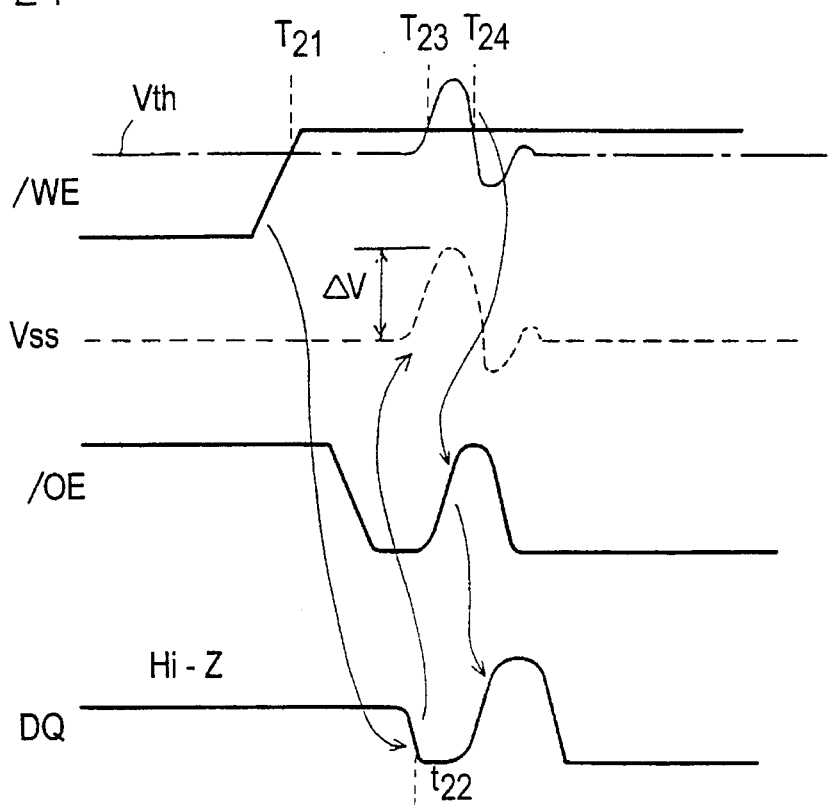
FIG. 24 is a signal waveform chart for use in illustration of an erroneous operation in the semiconductor memory shown in FIG. 22.

As a result, the stepped control voltage generation circuit 101 generates a control voltage changing in a descending stepped form, and the control voltage is applied to the gate of driving transistor 10 as the output signal So'. Thus, the transistor 10 gradually changes from a cut off state to a conduction state, and current supplied to a load through the output terminal DQ gradually changes as well. More specifically, sharp change in the output current can be prevented, generation of noise due to the parasitic inductances 301, 302 as illustrated in FIG. 22 can also be prevented by the function of the stepped control voltage generation circuit 101.

Figure 3:
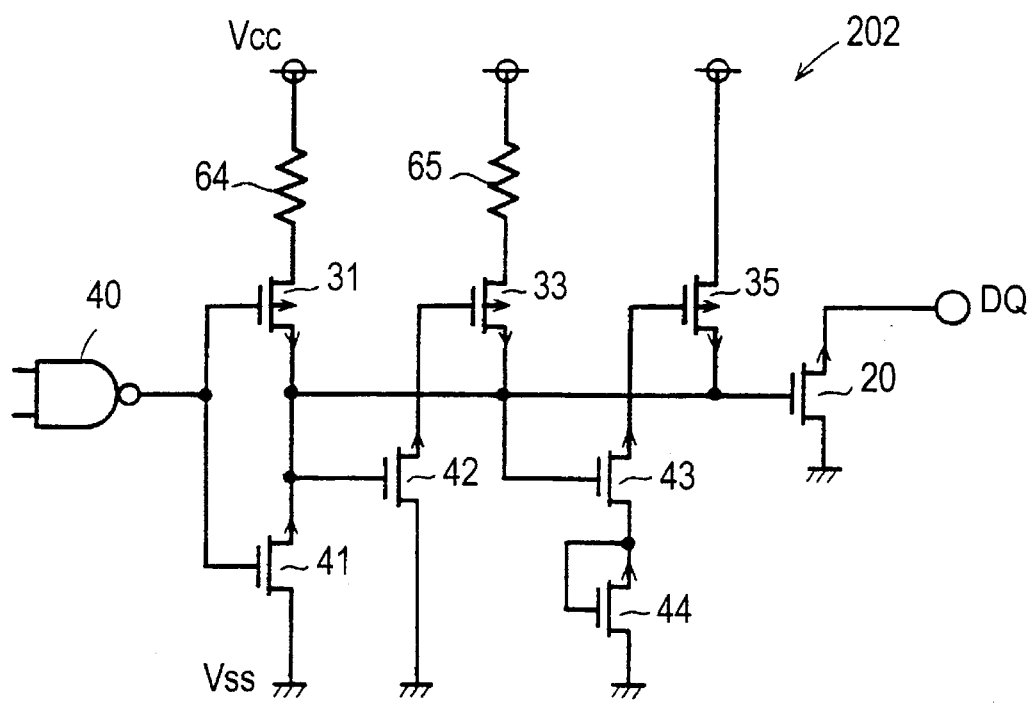
FIG. 3 is a circuit diagram showing an output driver circuit in accordance with another embodiment of the invention.

In the following, several variations of the stepped control voltage generation circuits 101 and 201 illustrated in FIG. 1 will be described. Referring to FIG. 3, a stepped control voltage generation circuit 202 is different from the circuit 201 shown in FIG. 1 in that a resistor 64 is provided in place of the diodes 61 and 62, and a resistor 65 is provided in place of the diode 63. The resistors 64 and 65 are formed of diffusion resistors or polysilicon resistors. In addition, the PMOS transistors 32 and 34 shown in FIG. 1 are omitted. The other circuit connection is the same as that in the circuit 201, and the stepped control voltage generation circuit 202 shown in FIG. 3 operates in the same manner as the circuit 201.

Figure 4:
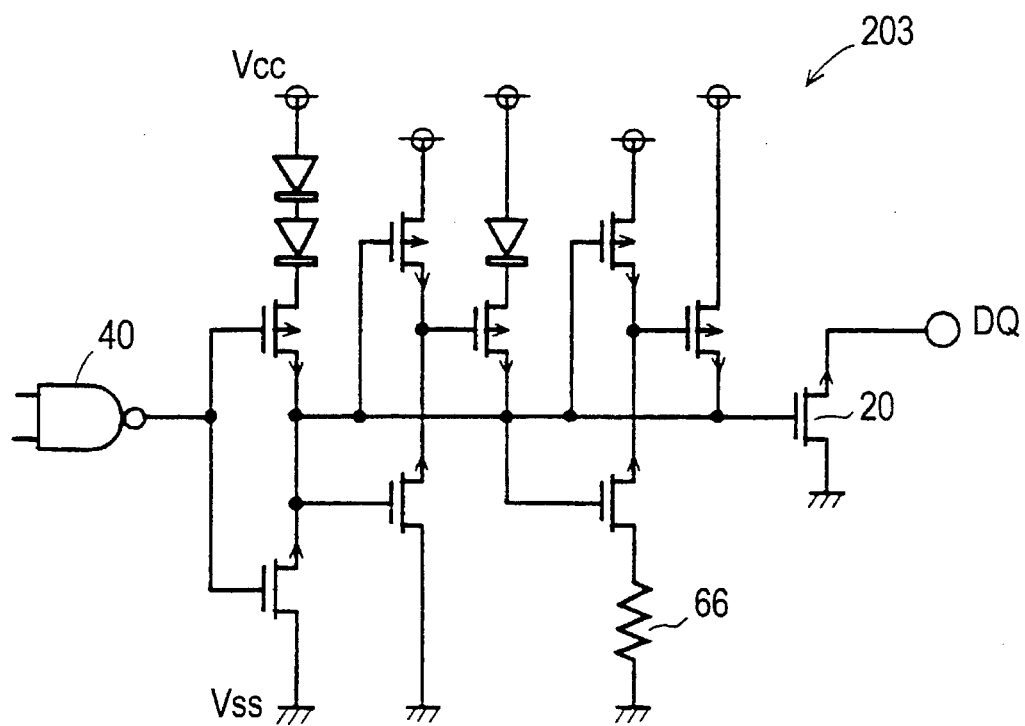
FIGS. 4 to 16 are circuit diagrams each showing an output driver circuit in accordance with a further embodiment of the invention.

Referring to FIG. 4, a stepped control voltage generation circuit 203 is different from the circuits 201 shown in FIG. 1 in that a resistor 66 is provided in place of the transistor 44 shown in FIG. 1. The resistor 66 is formed of a diffusion resistor or a polysilicon resistor. The other circuit connection is the same as that in the circuit 201 shown in FIG. 1, and the stepped control voltage generation circuit 203 shown in FIG. 4 operates in the same manner as the circuit 201.

Figure 5:
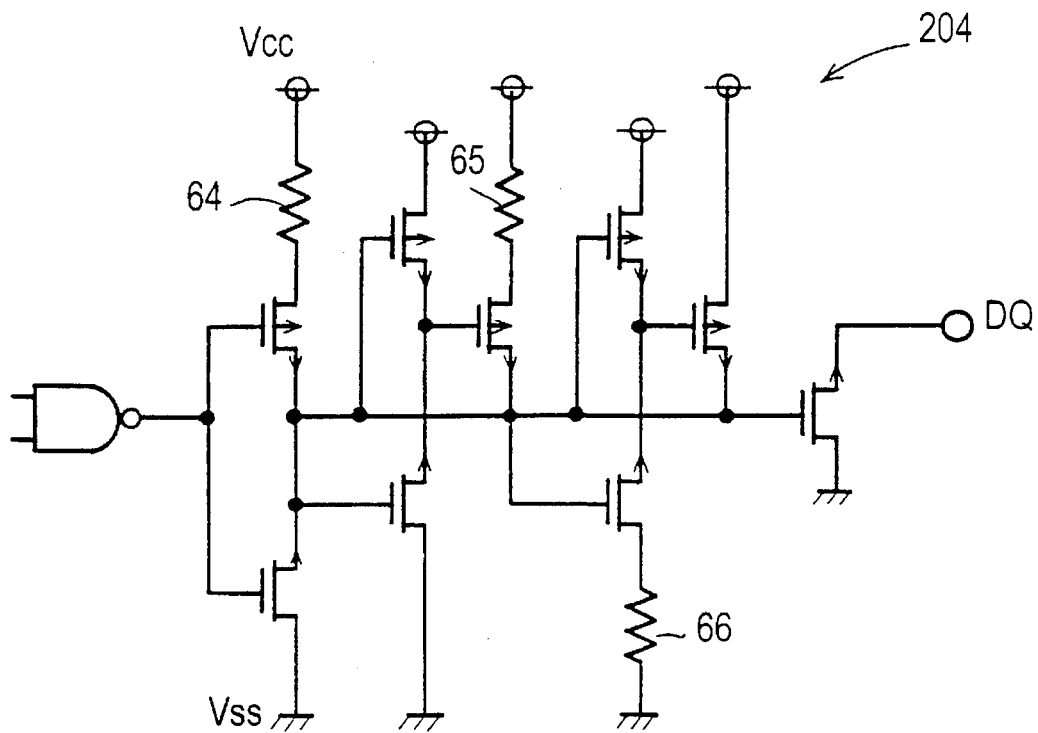

Referring to FIG. 5, a stepped control voltage generation circuit 201 is substantially identical to the circuit 201 shown in FIG. 1 with essential difference being that a resistor 64 is provided in place of the diodes 61 and 62, a resistor 65 in place of the diode 63, and a resistor 66 in place of the PMOS transistor 44. The other circuit connection is the same as that in the circuit 201, and the circuit 204 operates in the same manner as the circuit 201.

Figure 6:
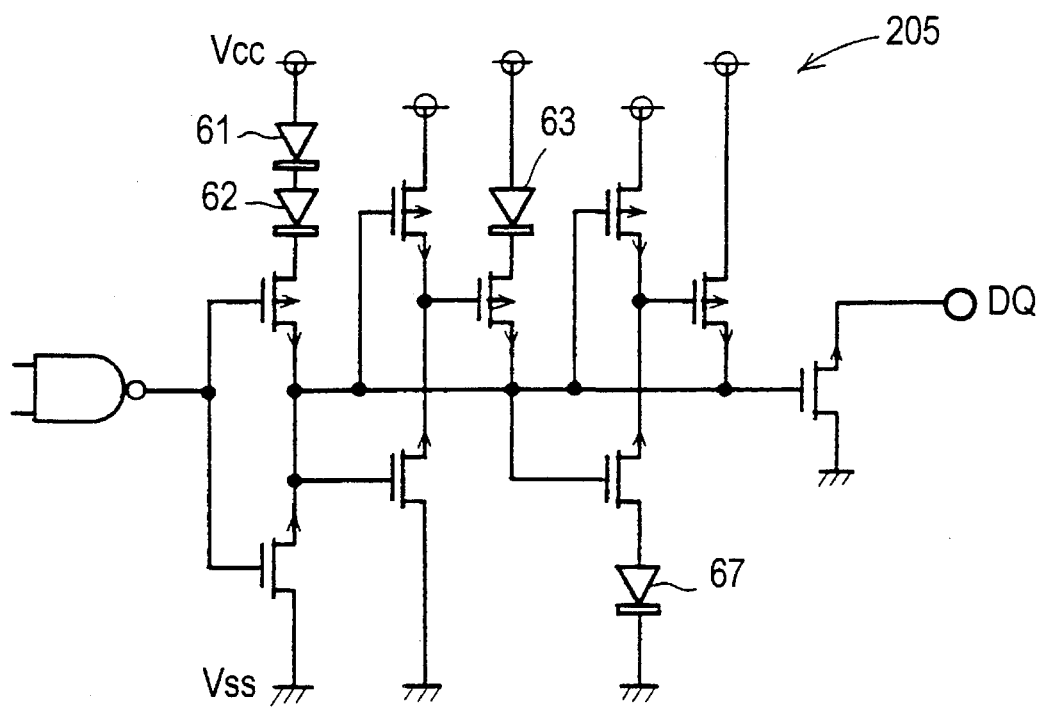

Referring to FIG. 6, a stepped control voltage generation circuit 205 is different from the circuit 201 shown in FIG. 1 in that a diode 67 is provided in place of the PMOS transistor 44. The other circuit connection is the same as that in the circuit 201 and the circuit 205 operates in the same manner as the circuit 201.

Figure 7:
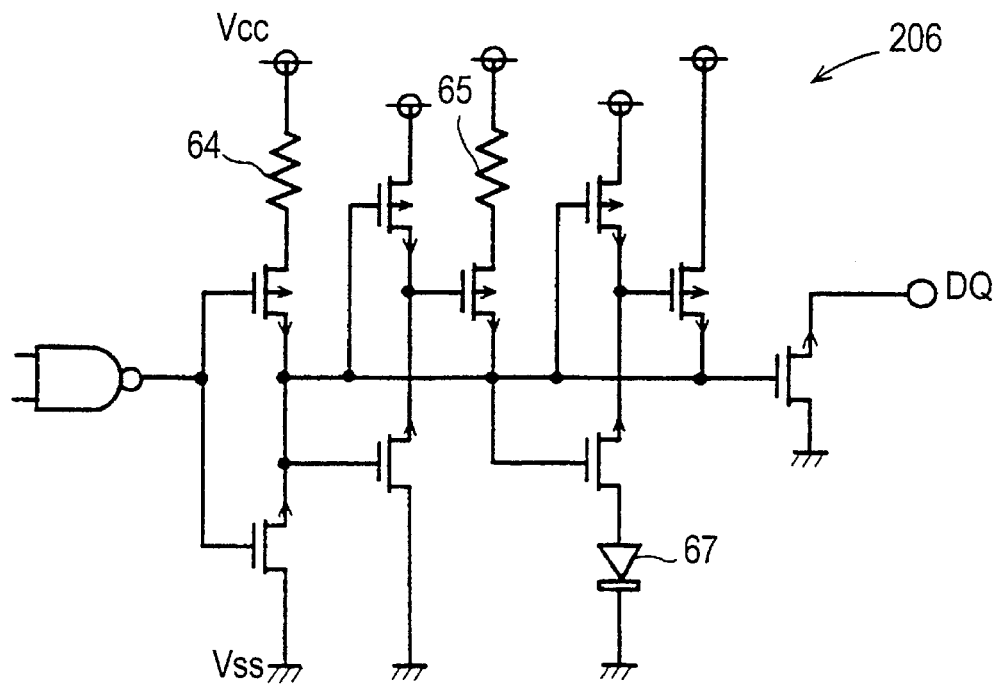

Referring to FIG. 7, a stepped control voltage generation circuit 206 is substantially identical to the circuit 201 shown in FIG. 1 with essential difference being that a resistor 64 is provided in place of the diodes 61 and 62, a resistor 65 in place of the diode 63, and a diode 67 in place of the NMOS transistor 44. The other circuit connection is the same as the circuit 201, and the circuit 206 operates in the same manner as the circuit 201.

Figure 8:
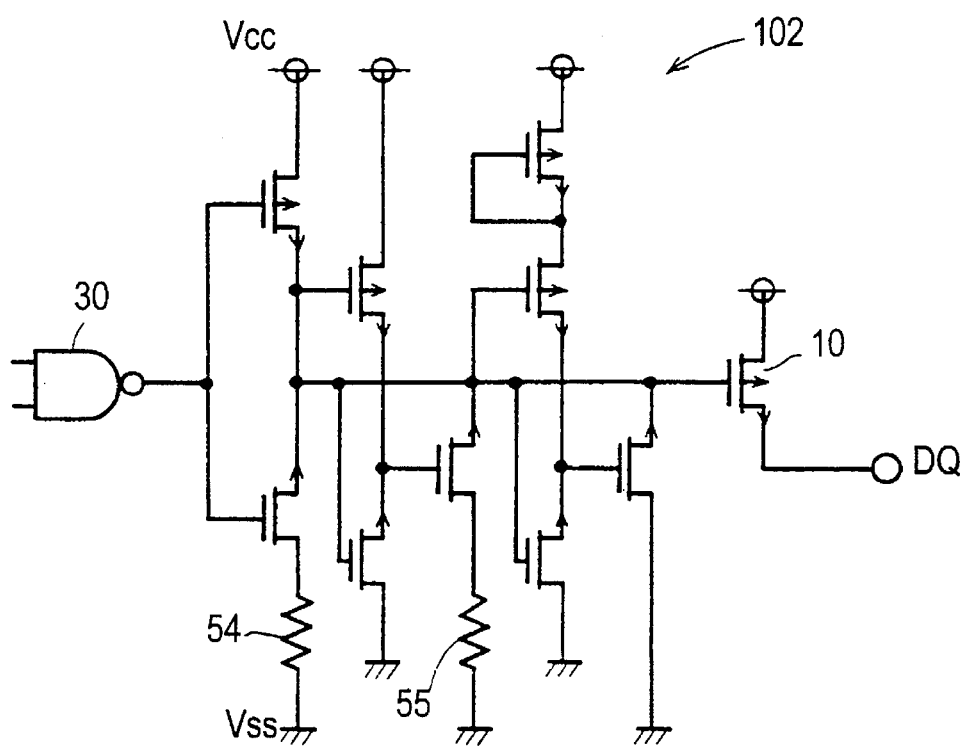

Referring to FIG. 8, a stepped control voltage generation circuit 102 is different from the circuit 101 shown in FIG. 1 in that a resistor 54 is provided in place of the diodes 51 and 52, and a resistor 55 in place of the diode 53. The other circuit connection is the same as that in the circuit 101, and the circuit 102 operates in the same manner as the circuit 101.

Figure 9:
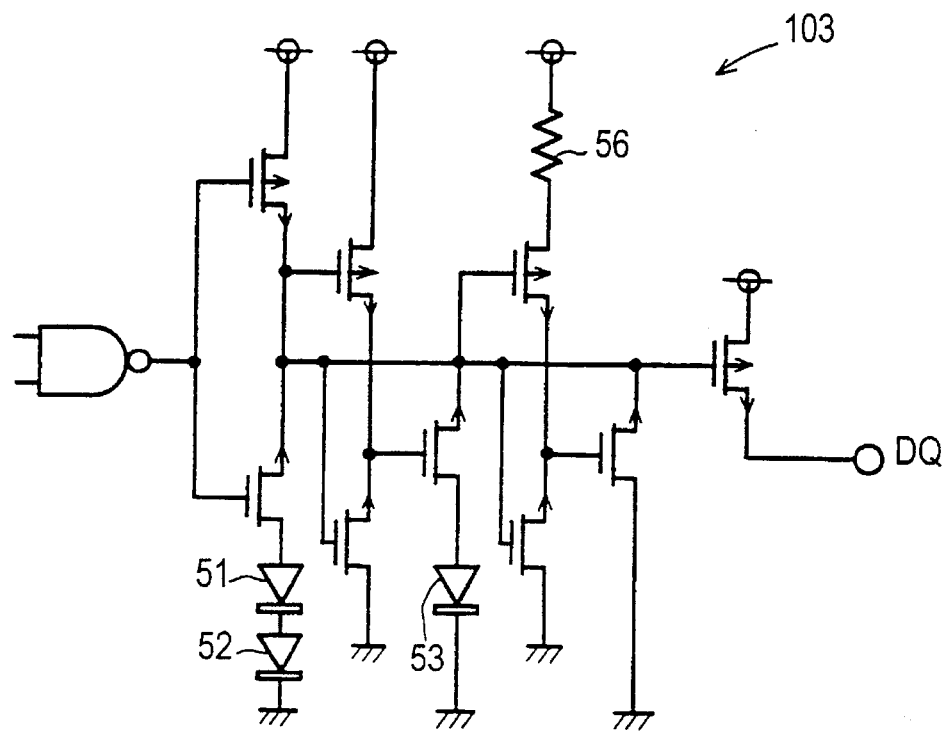

Referring to FIG. 9, a stepped control voltage generation circuit 103 is substantially identical to the circuit 101 shown in FIG. 1 with essential difference being that a resistor 56 is provided in place of the PMOS transistor 13. The other circuit connection is the same as that in the circuit 101 shown in FIG. 1, and the circuit 103 operates in the same manner as the circuit 101.

Figure 10:
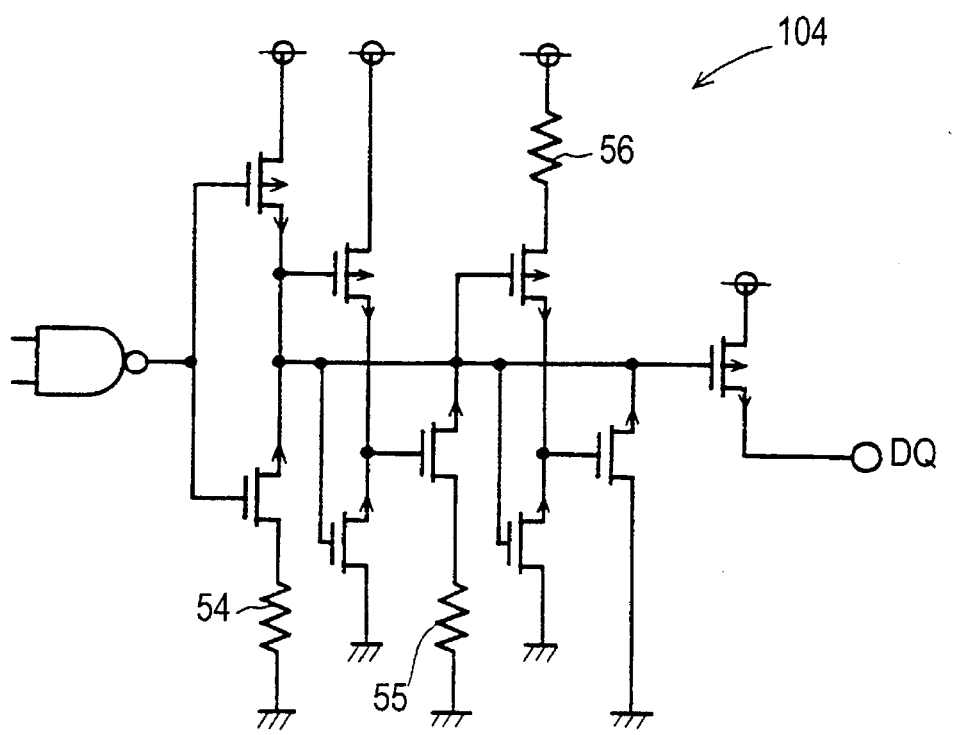

Referring to FIG. 10, a stepped control voltage generation circuit 104 is different from the circuit 101 shown in FIG. 1 in that a resistor 54 is provided in place of the diodes 51 and 52, a resistor 55 in place of the diode 53, and a resistor 56 in place of the PMOS transistor 13. The other circuit connection is the same as that in the circuit 101, and the circuit 104 operates in the same manner as the circuit 101.

Figure 11:
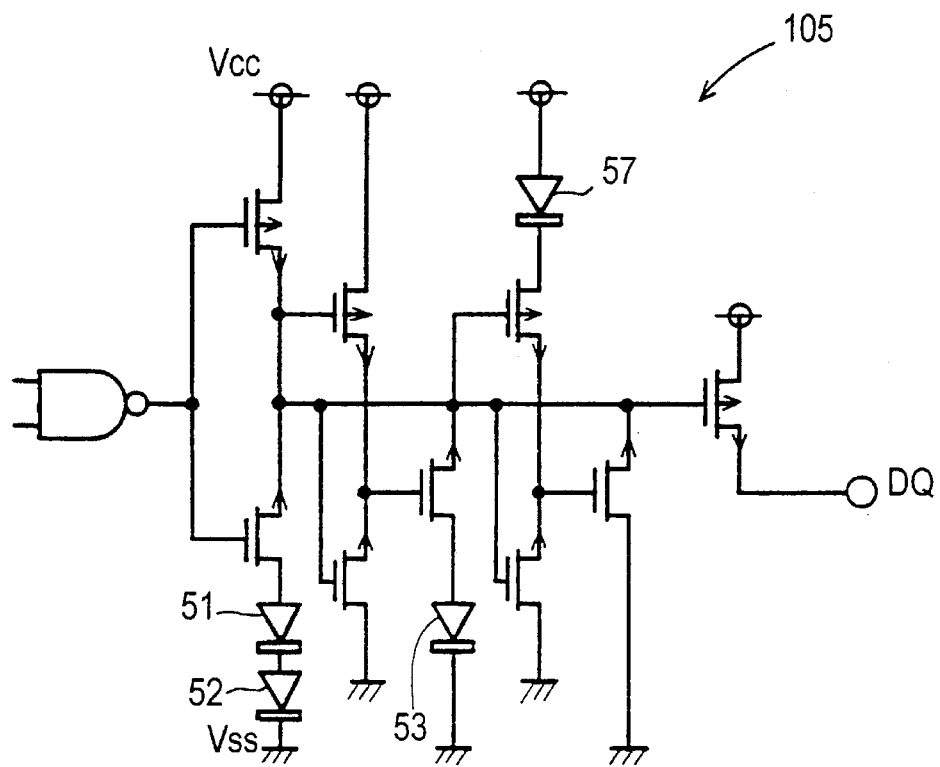

Referring to FIG. 11, a stepped control voltage generation circuit 105 is substantially identical to the circuit 101 shown in FIG. 1 with essential difference being that a diode 57 is provided in place of the PMOS transistor 13. The other circuit connection is the same as that in the circuit 101, and the circuit 105 operates in the same manner as the circuit 101.

Figure 12:
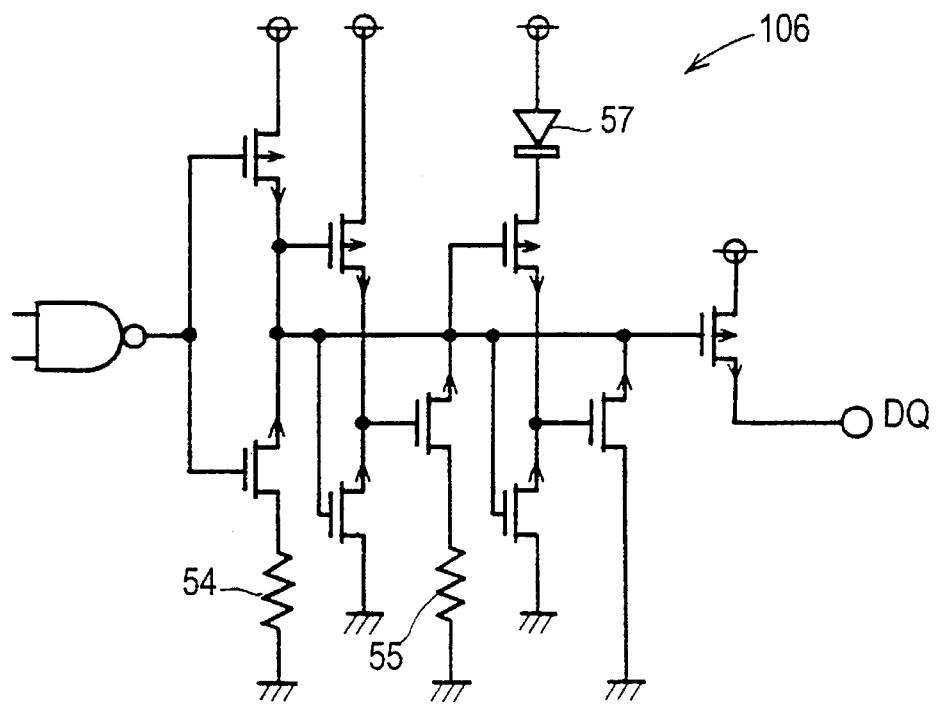

Referring to FIG. 12, a stepped control voltage generation circuit 106 is different from the circuit 101 shown in FIG. 1 in that a resistor 54 is provided in place of the diodes 51 and 52, and a resistor 55 in place of the diode 53, and a diode 57 in place of the PMOS transistor 13. The other circuit connection is the same as that in the circuit 101, and the circuit 106 operates in the same manner as the circuit 101.

Any of the stepped control voltage generation circuits 202 to 201 and 102 to 106 shown in FIGS. 3 to 12 may be applied in place of the circuit 101 and/or the circuit 201 in the output driver circuit shown in FIG. 1. In other words, an output driver circuit capable of preventing sharp change in output current can be provided by appropriately combining the stepped control voltage generation circuits 201 to 206 and 101 to 106 shown in FIG. 1 and FIGS. 3 to 12.

Figure 13:
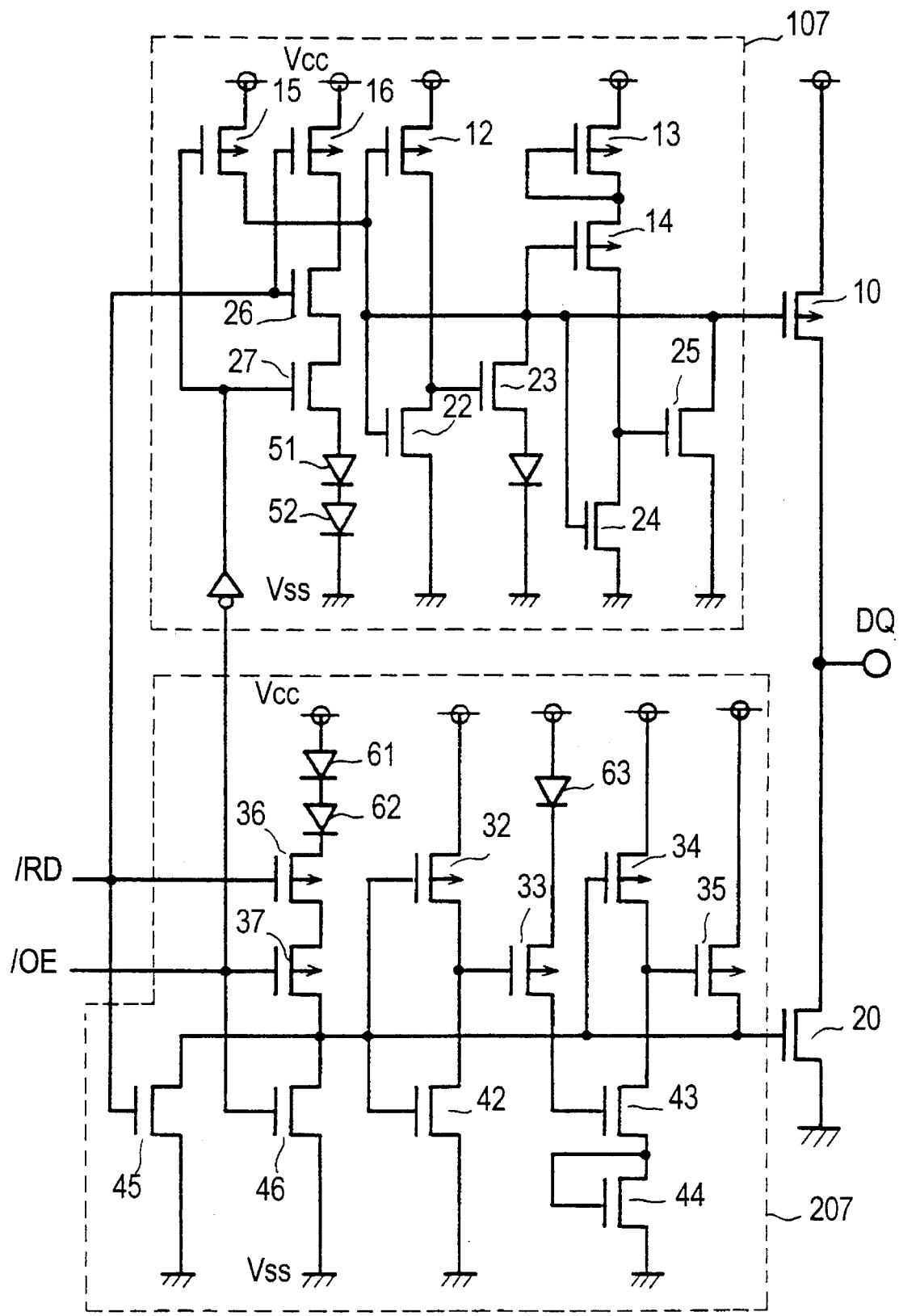

FIG. 13 is a circuit diagram showing an output driver circuit in accordance with a further embodiment of the invention. The output driver circuit shown in FIG. 13 is different from the circuit shown in FIG. 1 in that the NAND gates 30 and 40 are omitted, and the stepped control voltage generation circuits 107 and 207 are improved. In other words, the circuit functions of NAND gates 30 and 40 are additionally provided in the circuits of the respective first stages of the circuits 107 and 207.

Referring to FIG. 13, the first stage circuit of stepped control voltage generation circuit 207 includes diodes 61, 62, PMOS transistors 36 and 37, and an NMOS transistor 46 connected in series between a power supply potential Vss and a ground potential Vss, and an NMOS transistor 45 connected in parallel to the transistor 46. The transistors 36 and 45 have their gates connected to receive an input data signal /RD. The gates of transistors 37 and 46 receive an output enable signal /OE. A common connection node of the transistors 37 and 46 is connected to the gate of driving transistor 20. The succeeding stage circuits of the circuit 207 have a circuit connection the same as the succeeding stage circuits of the circuit 201 shown in FIG. 1.

The first stage circuit of stepped control voltage generation circuit 107 includes a PMOS transistor 16, NMOS transistors 26 and 27 connected in series between a power supply potential Vcc and a ground potential Vss, and a PMOS transistor connected in parallel to the transistor 16.

The gates of transistors 16 and 26 receive the input data signal /RD. The gates of transistors 15 and 27 receive an inverted output enable signal /OE. A common connection node of transistors 16 and 26 is connected to the gate of transistor 10. The succeeding stage circuits of the circuit 107 have a circuit connection the same as that of the succeeding stage circuits of the circuit 101 shown in FIG. 1.

The output driver circuit shown in FIG. 13 operates in the same manner as the circuit shown in FIG. 1, thus providing the same advantages. In addition, in the circuit shown in FIG. 13, since the NAND gates 30 and 40 are omitted, the circuit is simplified, and an output driver circuit having a higher operating speed can be provided.

Figure 14:
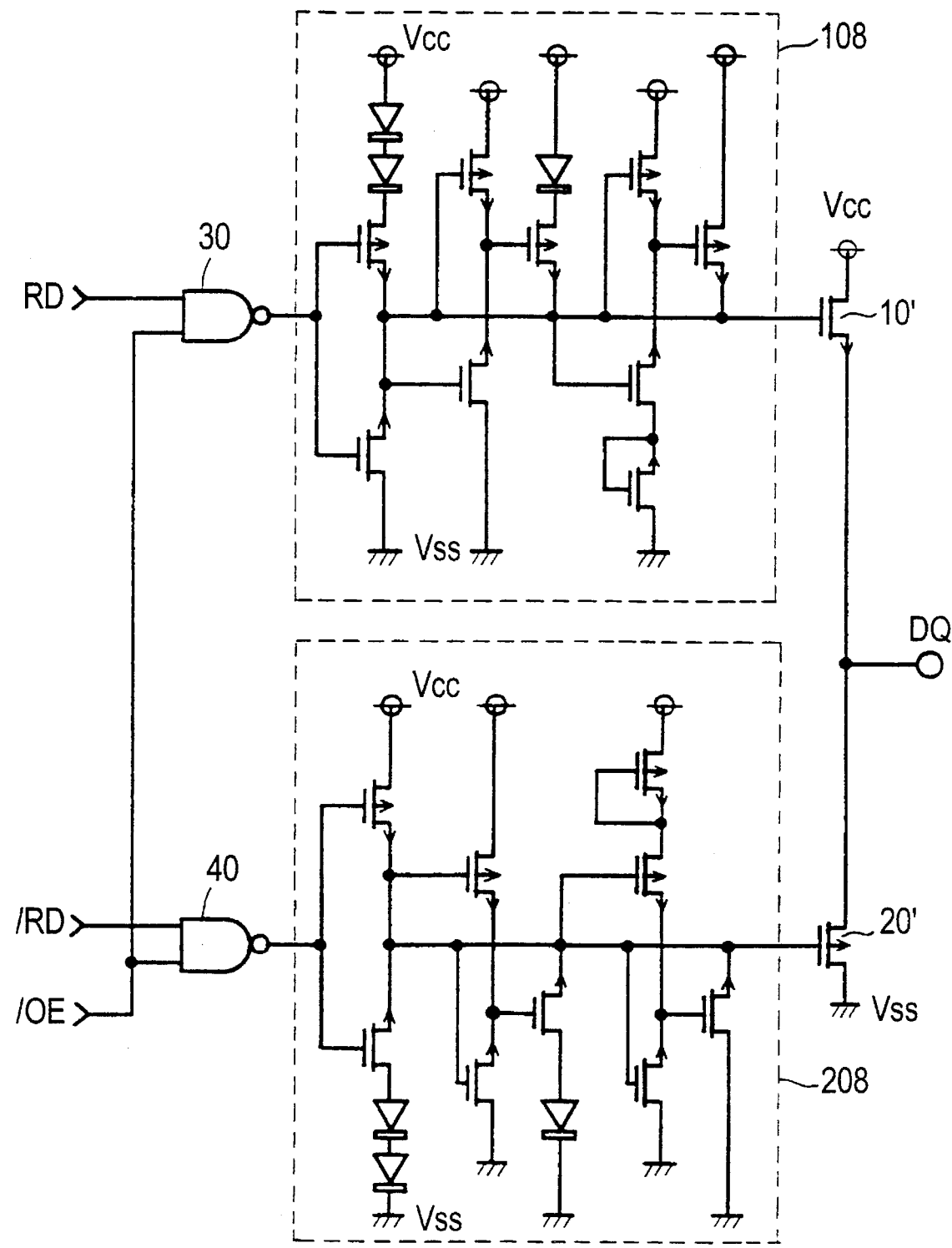

FIG. 14 is a circuit diagram showing an output driver circuit in according with a still further embodiment of the invention. Referring to FIG. 14, the output driver circuit includes an NMOS transistor 10' and a PMOS transistor 20' connected in series between a power supply potential Vcc and a ground potential Vss, a stepped control voltage generation circuit 108 for providing a stepped control voltage to the gate of transistor 10', and a stepped control voltage generation circuit 208 for providing a stepped control voltage to the gate of transistor 20'. The circuit shown in FIG. 14 is substantially identical to the circuit shown in FIG. 1 with essential difference being that the NMOS transistor 10' is used as a pull up transistor for driving, while the PMOS transistor 20' is used as a pull down transistor for driving. Accordingly, the stepped control voltage generation circuit 108 for controlling the transistor 10' has the same circuit configuration as that of the circuit 201 shown in FIG. 1. Meanwhile, the stepped control voltage generation circuit 208 for controlling the transistor 20' has the same circuit configuration as that of the circuit 101 shown in FIG. 1. As described above, it is pointed out that the type of the circuit configuration of a stepped control voltage generation circuit to be applied is decided depending upon the conductivity type (in other words, P type or N type) of a driving transistor to be controlled. Therefore, any of the circuits 202 to 206 and 102 to 106 shown in FIGS. 3 to 12 may be applied in place of the circuits 108 and/or 208 shown in FIG. 14.

The aforementioned stepped control voltage generation circuits each generate a stepped control voltage changing in a stepped form including three steps. It is pointed out that the invention may generally be implemented by a stepped control voltage generation circuit generating a stepped control voltage changing in a stepped form including a plurality of steps. The number of steps of a control voltage is decided in view of an operating speed required by a load connected to the output terminal DQ.

Figure 15:
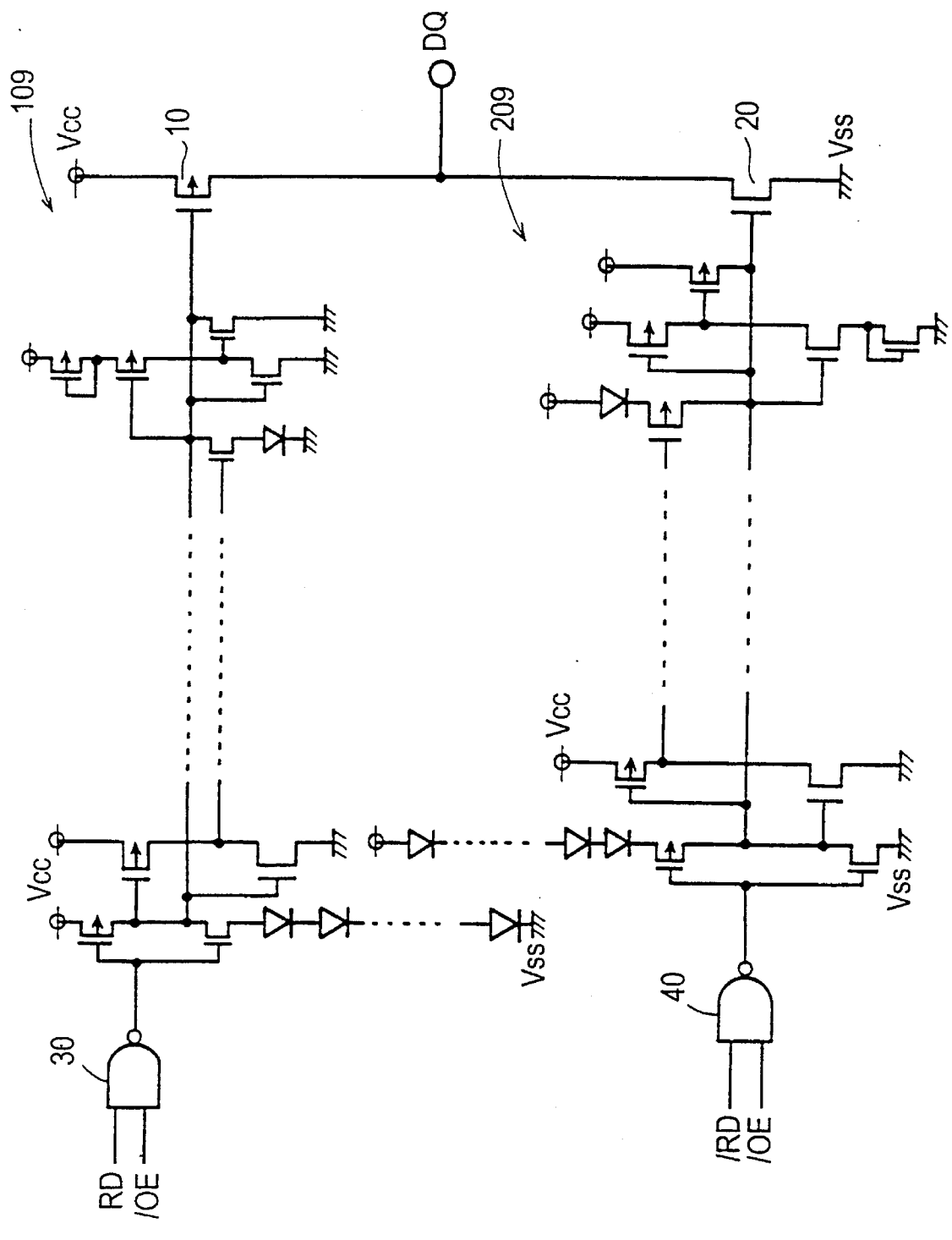

FIG. 15 is a circuit diagram showing an output driver circuit in accordance with a still further embodiment of the invention. Referring to FIG. 15, the output driver circuit includes a stepped control voltage generation circuit 109 for generating a stepped control voltage descending in a stepped form including a plurality of steps, and a stepped control voltage generation circuit 209 for generating a stepped control voltage rising in a stepped form including a plurality of steps. Application of the above-described stepped control voltage generation circuits in the similar manner as the circuits 109 and 209 shown in FIG. 15 provides a stepped control voltage including an arbitrary number of steps.

Figure 16:
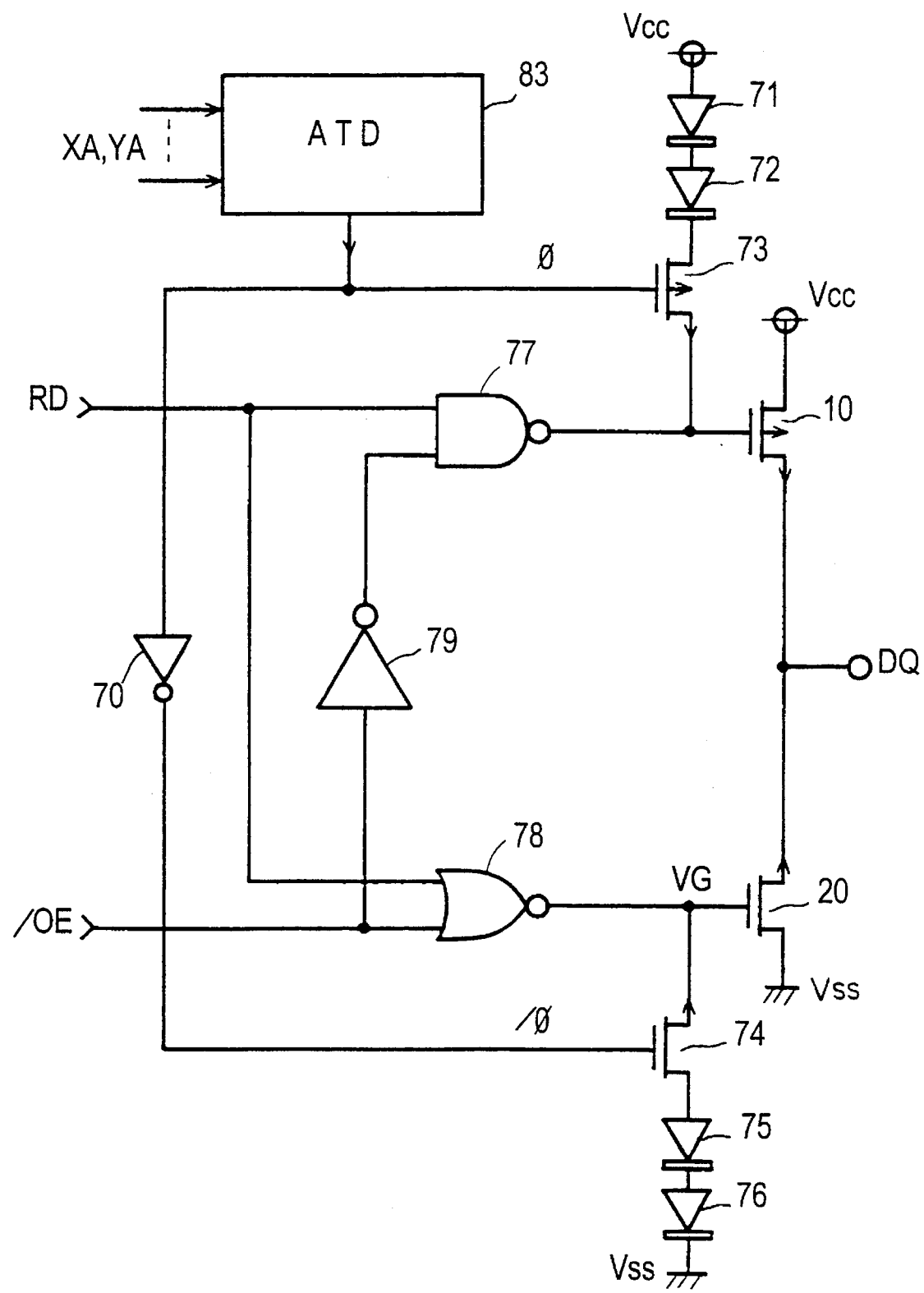

FIG. 16 is a circuit diagram showing an output driver circuit in accordance with a still further embodiment of the invention. Referring to FIG. 16, the output driver circuit includes a PMOS transistor 10 and an NMOS transistor 20 connected in series between a power supply voltage Vcc and a ground potential Vss, an NAND gate 77 for supplying a control voltage through the gate of transistor 10, and an NOR gate 78 for supplying a control voltage to the gate of transistor 20. The NAND gate 77 receives an input data signal RD through one input node, and receives an inverted output enable signal /OE through the other input node. The NOR gate 78 receives the input data signal RD through its one input node, and the output enable signal /OE through the other input node.

Figure 19:
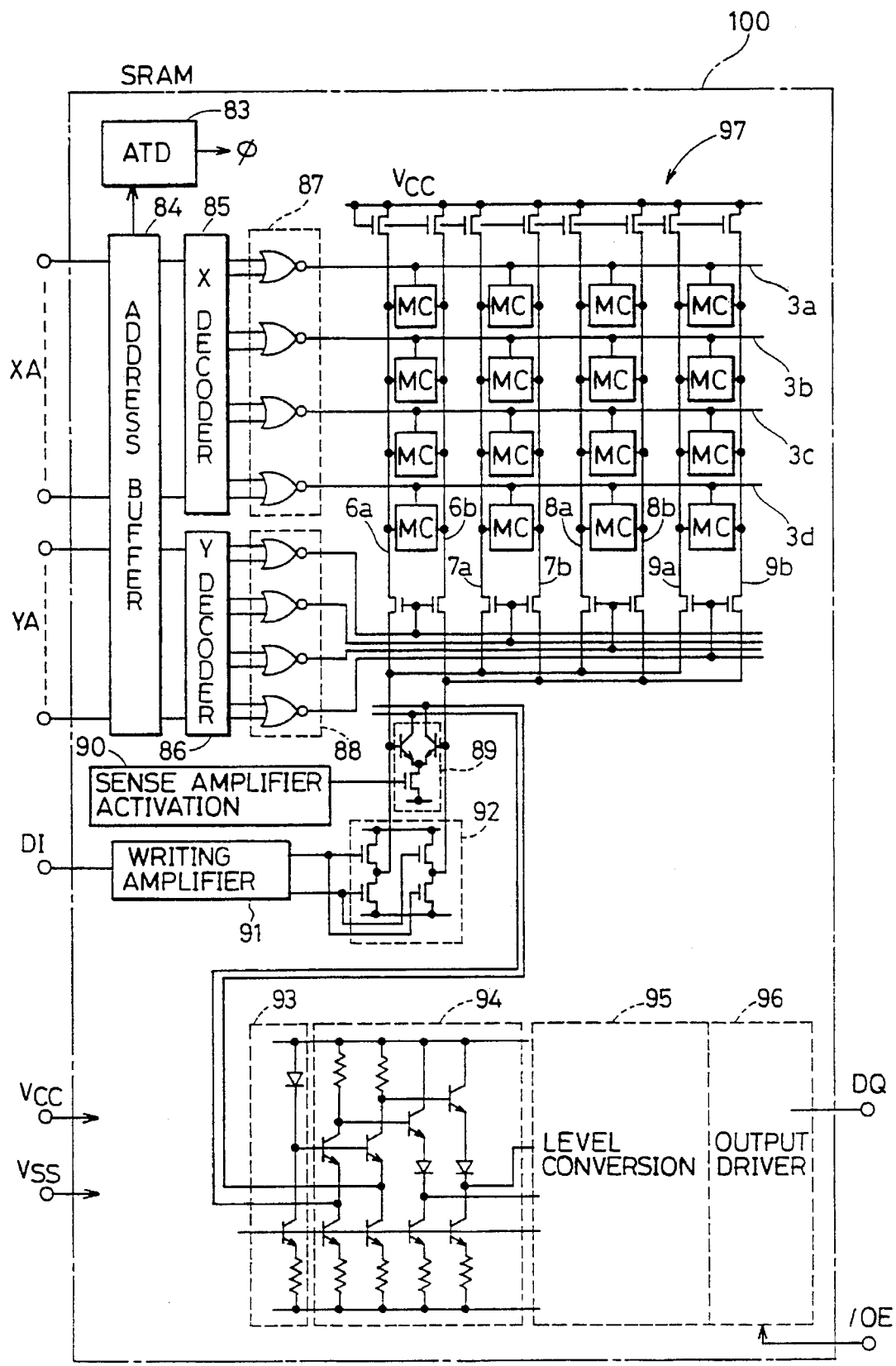
FIG. 19 is a block diagram showing the circuit of a conventional SRAM.
Figure 20:
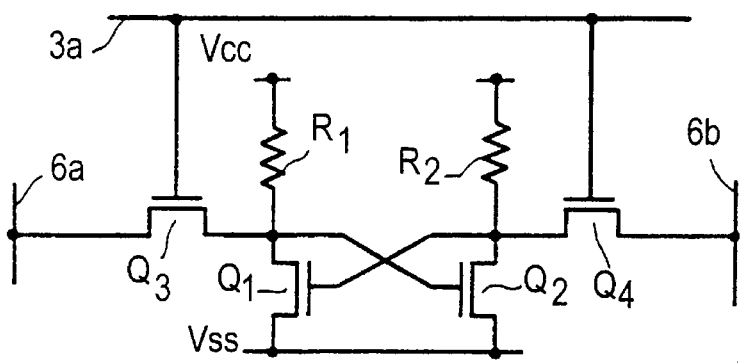
FIG. 20 is a circuit diagram showing an example of a memory cell used in the SRAM shown in FIG. 19.
Figure 21:
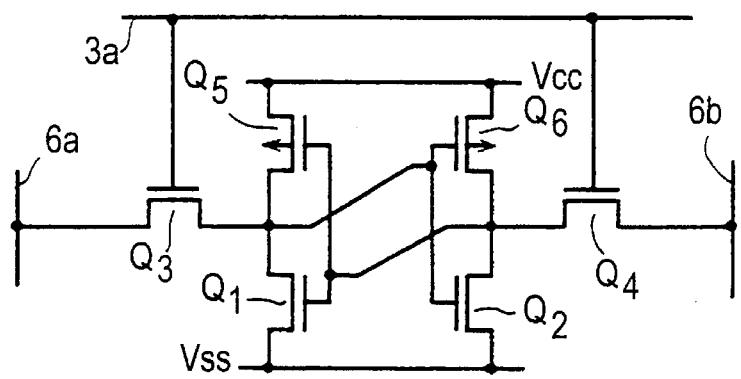
FIG. 21 is a circuit diagram showing another example of a memory cell used in the SRAM shown in FIG. 19.

Diodes 71, 72 and a PMOS transistor 73 are connected in series between the power supply potential Vcc and the gate of transistor 10. Meanwhile, an NMOS transistor 74, and diodes 75 and 76 are connected in series between the gate of transistor 20 and the ground potential Vss. The transistor 73 has its gates connected to receive a pulse signal φ output from an address transition detection circuit (hereinafter referred to as "ATD circuit"). The transistor 74 has its gates connected to receive a pulse signal /φ inverted by an inverter 70. The ATD circuit 83 receives externally applied addressed signals XA and YA through an address buffer 84 as shown in FIG. 19. The ATD circuit 83 responds to the transition of the applied address signals XA and YA and outputs the pulse signal 6. The mutual conductance of transistor 73 is designed to be a small value compared to the transistor 10. Similarly, the mutual conductance of transistor 74 is designed to be a small value compared to the transistor 20.

Figure 17:
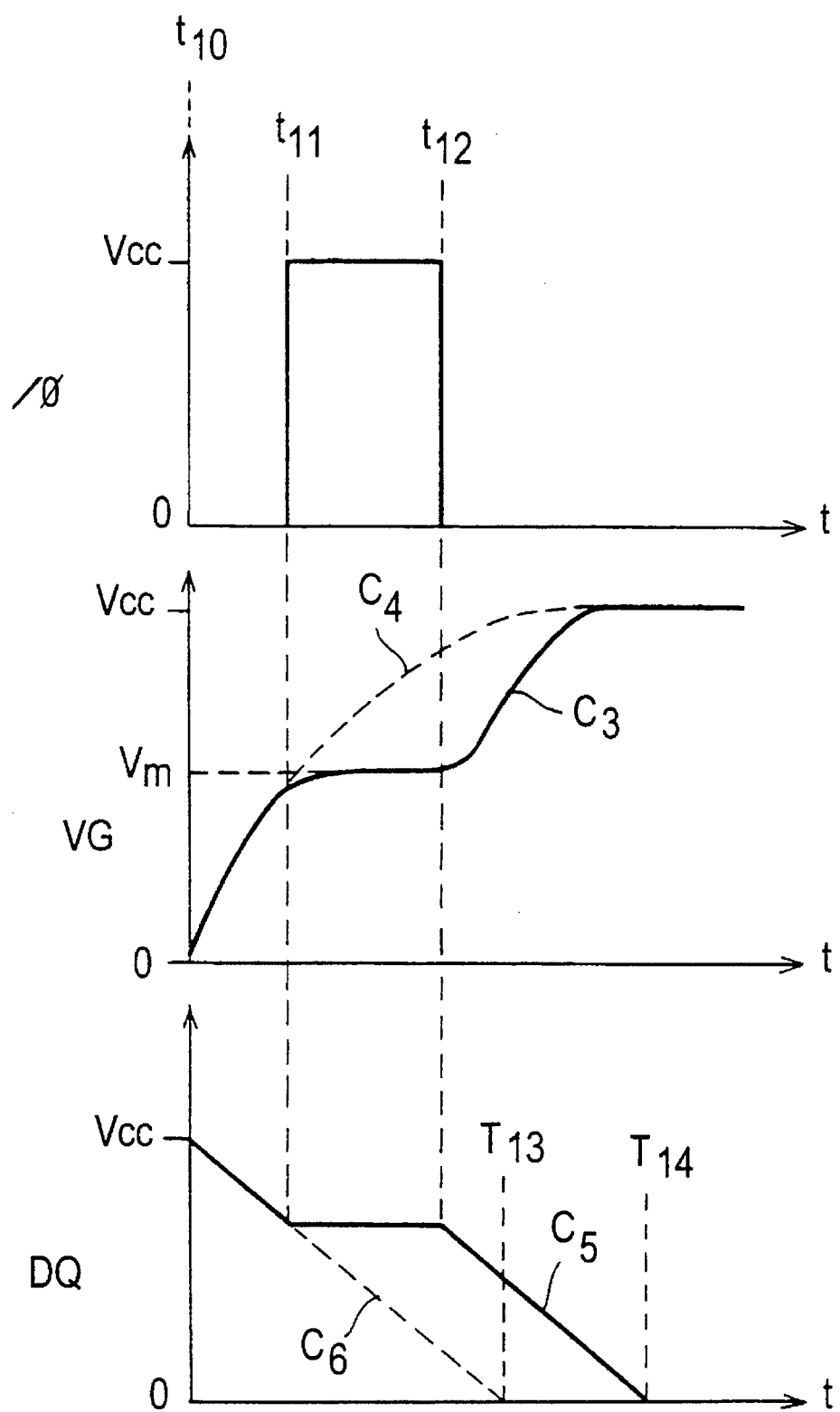
FIG. 17 is a timing chart for use in illustration of an operation of a stepped control voltage generation circuit shown in FIG. 16.

FIG. 17 is a timing chart for use in illustration of an operation of the output driver circuit shown in FIG. 16. Referring to FIGS. 16 and 17, the operation will be described. At time t10, the NOR gate 78 starts outputting a signal toward a high level (Vcc level) in response to the input data signal RD. Therefore, as illustrated in FIG. 17, during the period from t10 to t10, the gate voltage VG of driving transistor 20 rises as shown in FIG. 17. During the period from t11 to t12, the pulse signal /φ of a high level is applied from the ATD circuit 83 to the gate of transistor 74. Accordingly, the transistor 74 is turned on in this period, and the gate voltage VG of transistor 20 is temporarily held at an intermediate potential Vm decided by the conduction resistance of the diodes 75 and 76. Also in this embodiment, the diodes 75 and 76 are each formed of an MOS transistor having a threshold voltage Vth, and the intermediate potential Vm is Vss+2Vth.

After time t12, the pulse signal /φ rises. This turns off the transistor 74, and the gate voltage VG of transistor 20 once again starts rising in accordance with an output voltage toward a Vcc level from the NOR gate 78. As a result, the gate voltage VG changes as represented by the curve C3 shown in FIG. 17.

Therefore, the driving transistor 20 is temporarily brought to an intermediate conduction state during the period from t11 to t12, and then completely conducts at time t14. As a result, the output voltage DQ changes as represented by the curve C5 shown in FIG. 17. The curve C6 represents the change of output voltage when such a temporarily voltage holding circuit is not provided, in other words change in output voltage in a conventional circuit, for the purpose of comparison.

As can be seen from a comparison between the curves C5 and C6 shown in FIG. 17, the output voltage DQ of the conventional output driver circuit sharply falls (the curve C6), while the output voltage DQ of the output driver circuit falls more mildly as a whole (the curve C5). As a result, sharp change in output current flowing through the output terminal DQ can be prevented, thus restraining generation of noise due to the parasitic inductances 301, 302 shown in FIG. 22.

It is noted that in the above description, control of the gate voltage VG of the pull down transistor 20 has been dealt with, similar control may be conducted as to the control voltage of the pull up transistor 10, thereby restraining generation noise.

More specifically, after the NAND gate 77 outputs a control voltage descending in response to the input data signal RD, a negative pulse signal φ is generated from the ATD circuit 83. Since the transistor 73 conducts in response to the negative pulse signal φ, a control voltage of Vcc–2Vth is applied to the gate of transistor 10 during a conduction period. Therefore, the transistor 10 is turned on in this period in an intermediate conduction state decided by the gate voltage Vcc–2Vth. After the period in which the pulse signal φ is negative is completed, the transistor 73 is turned off, and a control voltage toward a low level output from the NAND gate 77 is applied to the gate of transistor 10 as a result. Therefore, the transistor 10 is brought to a complete cut off state. Consequently, sharp change in output current can be prevented, thus restraining generation of noise.

Figure 18:
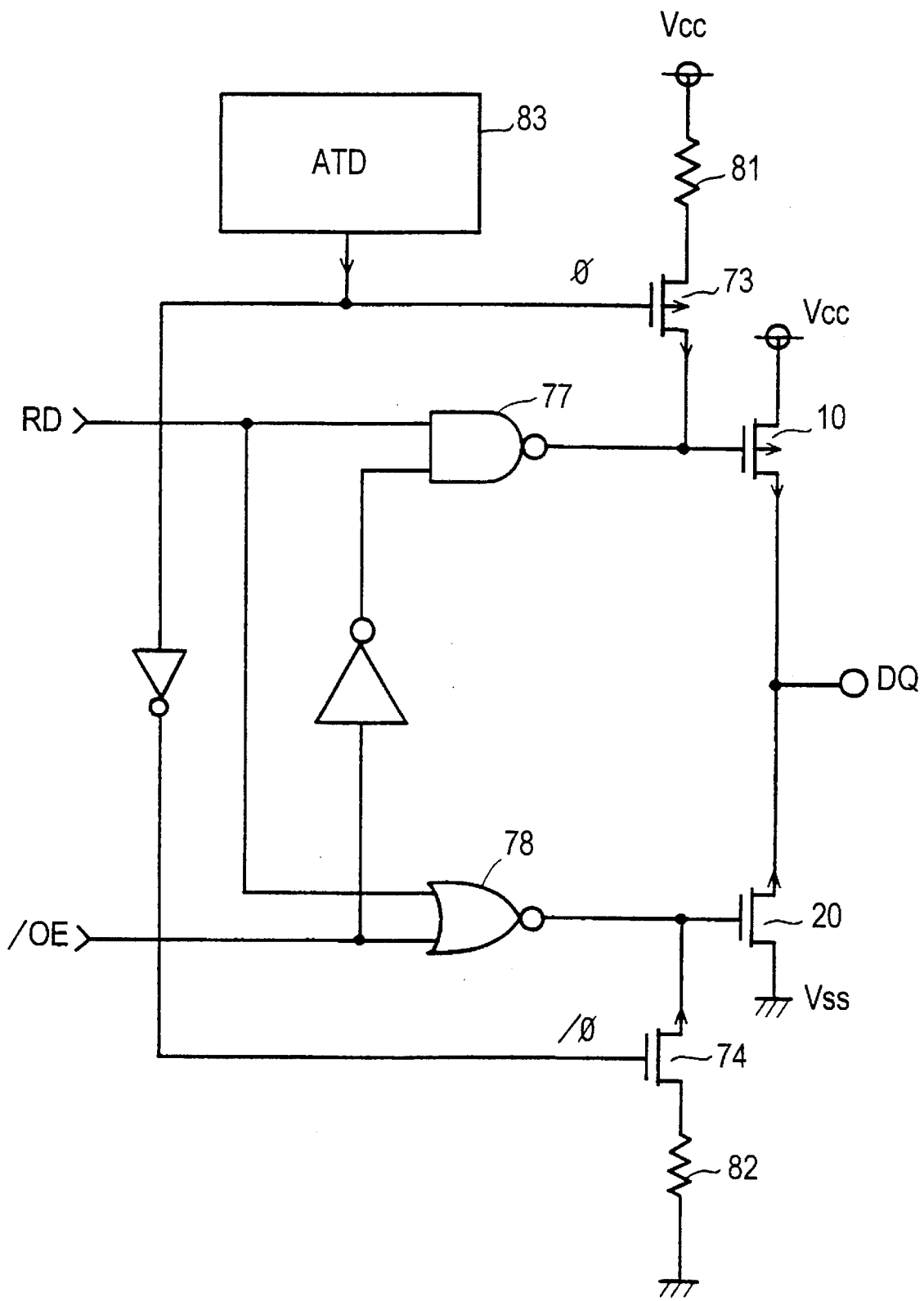
FIG. 18 is a circuit diagram showing an output driver circuit in accordance with a still further embodiment of the invention.

FIG. 18 is a circuit diagram showing an output driver circuit in accordance with a still further embodiment of the invention. Referring to FIG. 18, as compared to the output driver circuit 16, a resistor 81 is provided in place of the diodes 71 and 72, and a resistor 82 in place of the diodes 75 and 76. The other circuit connection is the same as that in the circuit shown in FIG. 16, and the same advantages are provided.

In the embodiments shown in FIGS. 16 and 18, the pulse signal φ generated from the ATD circuit 83 is utilized. The pulse signal φ is generated in response to transitions of the externally applied address signals XA and YA. It is noted that a circuit for generating the pulse signal φ in response to another externally applied control signal instead of the ATD circuit 83 may be used.

Thus, in any of the aforementioned output driver circuits, a stepped control voltage is applied to the gate of the driving transistor driving the output terminal DQ. Therefore, the driving transistor can be prevented from instantaneously changing its state from a cut off state to a conduction state. In other words, the driving transistor gradually changes toward the conduction state. Accordingly, sharp change in output current flowing through the output terminal DQ can be prevented, noise due to the parasitic inductances 301, 302 shown in FIG. 22 can be prevented. Consequently, the levels of the power supply line Vcc and the ground line Vss can be prevented from changing due to the noise, thus avoiding an erroneous operation in the semiconductor memory.

In the above description, the cases in which the invention is applied to an SRAM in other words a semiconductor memory have been described, but the invention is generally applicable as an output driver circuit in a semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output driver circuit comprising:

an output terminal;

a driving transistor connected between a power supply potential and said output terminal for driving a load connected to said output terminal; and stepped control voltage generation means responsive to an applied input signal for generation a stepped control voltage changing in a stepped from including a plurality of steps, said stepped control voltage being supplied to the control electrode of said driving transistor, wherein said stepped control voltage generation means includes first control voltage generation means connected between the power supply potential and the control electrode of said driving transistor and responsive to the input signal for generating a first control voltage having a first predetermined level;

second control voltage generation means connected between the power supply potential and the control electrode of said driving transistor and responsive to said first control voltage for generating a second control voltage having a second predetermined level; and third control voltage generation means connected between the power supply potential and the control electrode of said driving transistor and responsive to said second control voltage for generating a third control voltage having a third predetermined level, said first, second, and third control voltages being supplied to the control electrode of said driving transistor, and wherein said first control voltage generation means includes first resistance means and first switching means connected in series between the power supply potential and the control electrode of said driving transistor, said first switching means operating in response to the input signal, said second control voltage generation means includes second resistance means and second switching means connected between the power supply potential and the control electrode of said driving transistor, said second switching means operating in response to a voltage applied through said first switching means, and said third control voltage generation means includes third switching means connected between the power supply potential and the control electrode of said driving transistor, said third switching means operating in response to a voltage applied through said second switching means.

2. An output driver circuit as recited in claim 1, wherein said first resistance means has a higher resistance than said second resistance means.

3. An output driver circuit as recited in claim 1, wherein said first and second resistance means are first and second diode means, respectively each having a conduction resistance.

4. An output driver circuit, comprising:

an output terminal;

a driving transistor connected between a power supply potential and said output terminal for driving a load connected to said output terminal;

control voltage generation means responsive to an applied input signal for generating a control voltage for controlling said driving transistor, the control voltage generated from said control voltage generation means being supplied to a control electrode of said driving transistor;

address transition detector means responsive to an externally applied address signal for detecting a transition of the address signal; and temporary voltage holding means responsive to said address transition detector means for temporarily holding the control voltage generated from said control voltage generation means at a predetermined intermediate potential, said temporary voltage holding means including resistor means and switching means connected in series between the power supply potential and the control electrode of said driving transistor, said switching means conducting in response to an output of said address transition detector means.

5. An output driver comprising:

an output terminal;

a driving transistor connected between a power supply potential and said output terminal for driving a load connected to said output terminal;

control voltage generation means responsive to an applied input signal for generating a control voltage for controlling said driving transistor, the control voltage generated from said control voltage generation means being supplied to the control electrode of said driving transistor; and temporary voltage holding means responsive to an externally applied control signal for temporarily holding the control voltage generated from said control voltage generation means at a predetermined intermediate potential, wherein said temporary holding means includes resistance means and switching means connected in series between the power supply potential and the control electrode of said driving transistor, said switching means conducting in response to the externally applied control signal, wherein said resistance means is a diode means having a conduction resistance.

6. An output driver circuit, comprising:

an output terminal;

first and second driving transistors connected in series between first and second power supply potentials for driving a load connected to said output terminal, said output terminal being connected to a common connection node of said first and second driving transistors;

first and second control voltage generation means each responsive to an applied signal for generating respective control voltages each for controlling a corresponding one of said first and second driving transistors, the control voltage generated from said first control voltage generation means being supplied to a control electrode of said first driving transistor, the control voltage generated from said second control voltage generation means being supplied to a control electrode of said second driving transistor;

address transition detector means responsive to an externally applied address signal for detecting a transition of the address signal; and temporary voltage holding means responsive to said address transition detector means for temporarily holding the control voltages generated from said first and second control voltage generation means at a predetermined intermediate potential, said temporary voltage holding means including first resistor means and switching means connected in series between the first power supply potential and the control electrode of said first driving transistor and second resistor means and switching means connected between the second power supply potential and the control electrode of said second driving transistor, said first switching means conducting in response to a first output of said address transistor detector means and said second switching means conducting in response to a second output of said address transition detector means.

7. An output driver circuit as recited in claim 6, wherein said first temporary voltage holding means selectively holds one of the control voltages generated from said first and second control voltage generation means in response to said address transition detector means.

* * * * *